(12) United States Patent
Ahn et al.

(10) Patent No.: US 6,599,786 B1
(45) Date of Patent: Jul. 29, 2003

(54) ARRAY SUBSTRATE FOR LIQUID CRYSTAL DISPLAY AND THE FABRICATION METHOD OF THE SAME

(75) Inventors: Byung-chul Ahn, Kyoungsangbuk-do (KR); Byoung-ho Lim, Kyoungsangbuk-do (KR); Soon-sung Yoo, Kyoungsangbuk-do (KR); Yong-wan Kim, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/657,477

(22) Filed: Sep. 7, 2000

(30) Foreign Application Priority Data

Sep. 8, 1999 (KR) .......................... 11-038016

(51) Int. Cl.[7] .............................. H01F 21/00
(52) U.S. Cl. ...................... 438/155; 438/30; 438/48; 438/149
(58) Field of Search ................ 438/29, 30, 149, 438/151, 155, 48, 164, 597

(56) References Cited

U.S. PATENT DOCUMENTS 5,825,449 A * 10/1998 Shin ........................... 349/148
5,946,547 A * 8/1999 Kim et al. ..................... 438/30
6,043,511 A * 3/2000 Kim ............................. 257/59
6,218,211 B1 * 4/2001 Blouke et al. ................ 438/75
6,287,899 B1 * 9/2001 Park et al. ................... 438/149

FOREIGN PATENT DOCUMENTS

JP 07-199227 9/1994

* cited by examiner

Primary Examiner—Amir Zaradian
Assistant Examiner—Pamela E Perkins
(74) Attorney, Agent, or Firm—McKenna Long & Aldridge LLP (57) ABSTRACT

A method of manufacturing an LCD array substrate and LCD made by that method are disclosed. A plurality of gate lines, gate electrodes and gate extension lines are formed by depositing and patterning a first metallic material using a first mask. A first insulating layer is then formed. A plurality of data lines, source electrodes, drain electrodes, and capacitor electrodes are then formed by depositing and patterning suitable materials using a second mask. A passivation layer is then formed and patterned to create first and second contact holes using a third mask. The first contact holes expose the drain electrodes, the second contact holes expose the capacitor electrodes. A plurality of pixel electrodes are then formed by depositing and patterning a transparent conductive layer using a fourth mask. The pixel electrodes contact the drain electrodes through the first contact holes and contact the capacitor electrodes through the second contact holes.

18 Claims, 9 Drawing Sheets

ARRAY SUBSTRATE FOR LIQUID CRYSTAL DISPLAY AND THE FABRICATION METHOD OF THE SAME

CROSS REFERENCE

This application claims the benefit of Korean Patent Application No. 1999-0038016, filed on Sep. 8, 1999, under 35 U.S.C. §119, the entirety of which is hereby incorporated by reference.

BACKGROUND OF THE INVENTION

1. Field of the Invention

The present invention relates to a liquid crystal display (LCD) device and a method of fabricating the LCD device, and more particularly, to an array substrate having thin film transistors for the liquid crystal display device and the method of fabricating the array substrate.

2. Description of Related Art

Recently, according to a rapid development in a thin-film-transistor addressed liquid crystal display device (TFT/LCD, hereinafter noted simply as a liquid crystal display device), various portable electric appliances adopt the liquid crystal display device due to its advantage in a light weight and a wide applicability. Thus, an improved manufacturing process technology of the liquid crystal display device becomes required for a cheaper production cost and a higher productivity.

The liquid crystal display device manufacturing process requires repeated steps of depositing and patterning of various layers. The patterning step adopts a photolithography mask step including a light exposing with a mask. Since one cycle of the photolithography step is facilitated with one mask, the number of masks used in the fabrication process is a critical factor in determining the number of patterning steps. Namely, the production cost substantially depends on the number of masks used in the manufacturing process.

Now, referring to the attached drawings, a conventional array substrate of the liquid crystal display device manufactured by a conventional method is explained in detail. For convenience of explanation, the attached drawings of plan views do not illustrate insulating layers interposed between metal films, but the insulating layers are shown in the cross-sectional views.

Figure 1:
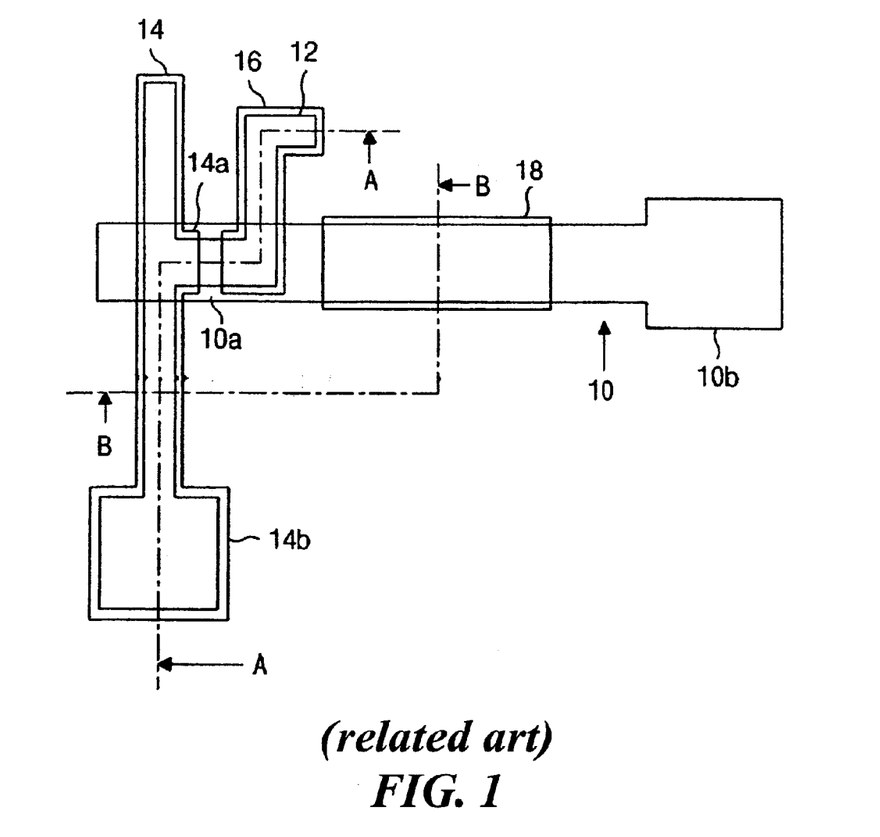
FIG. 1 is a schematic plan view illustrating source and drain electrodes formed on an array substrate according to a conventional manufacturing method.
Figure 2A:
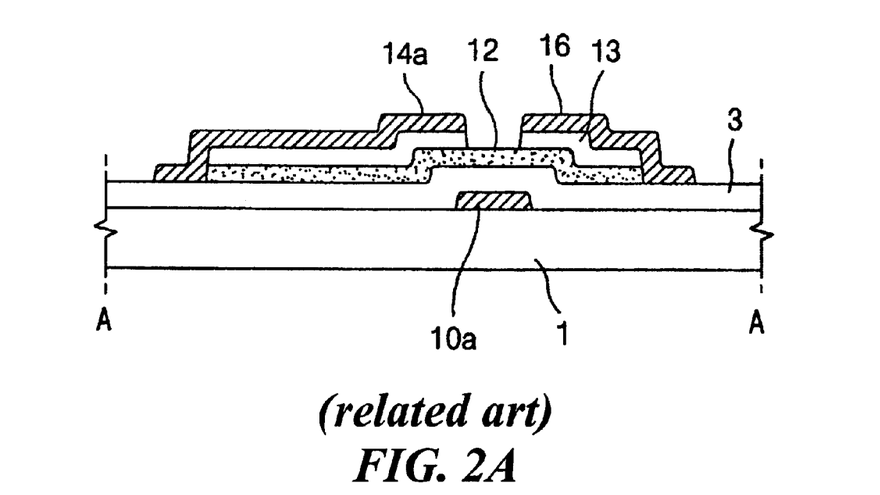
FIG. 2A is a cross-sectional view taken along the line "A—A" of FIG. 1.
Figure 2B:
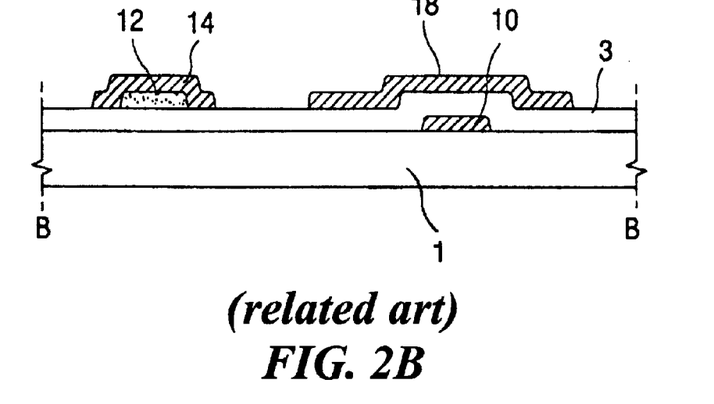
FIG. 2B is a cross-sectional view taken along the line "B—B" of FIG. 1.

In FIGS. 1, 2A and 2B, on a transparent insulating substrate 1, a gate line 10 is horizontally formed with a data line 14 formed perpendicular to the gate line 10. Near a cross point between the gate and data lines 10 and 14, a portion of the gate line 10 is protruded as a gate electrode 10a, and, at one end of the gate line 10, a gate pad 10b is positioned. Further, near the cross point between the gate and data lines 10 and 14, a source electrode 14a is protruded from the data line 14, and, spaced apart from the source electrode 14a, a drain electrode 16 is formed. Also at one end of the data line 14, a data pad 14b is positioned.

Herein, in the same layer of the data line 14, between the drain electrode 16 and the gate pad 10b, a capacitor electrode 18 of the same material as the data line 14 is formed in shape of an island. The capacitor electrode 18 overlaps a corresponding portion of the gate line 10 so that the capacitor electrode 18 makes a storage capacitor together with the corresponding overlapped portion of the gate line 10.

FIGS. 2A and 2B illustrate cross-sections taken along lines "A—A" and "B—B" of FIG. 1, respectively. As shown in FIGS. 2A and 2B, a conductive metal layer is deposited on a surface of the substrate 1, and patterned with a first mask so as to form the gate line 10 including the gate electrode 10a and the gate pad 10b.

On the whole surface including the gate lines of the substrate 1, an insulating material, a semiconductor material, and a doped semiconductor material are sequentially deposited, and patterned with a second mask so as to form a first insulating layer 3, a semiconductor layer 12, and an ohmic contact layer 13.

Next, another conductive metallic material is deposited on the whole surface including the ohmic contact layer 13 of the substrate 1, and thereafter the metal layer and the ohmic contact layer 13 are patterned with a third mask so that the source, drain and capacitor electrodes 14a, 16 and 18 are formed. At this point, between the source and drain electrodes 14a and 16, a back channel is opened so as to expose a portion of the semiconductor layer 12.

Figure 3:
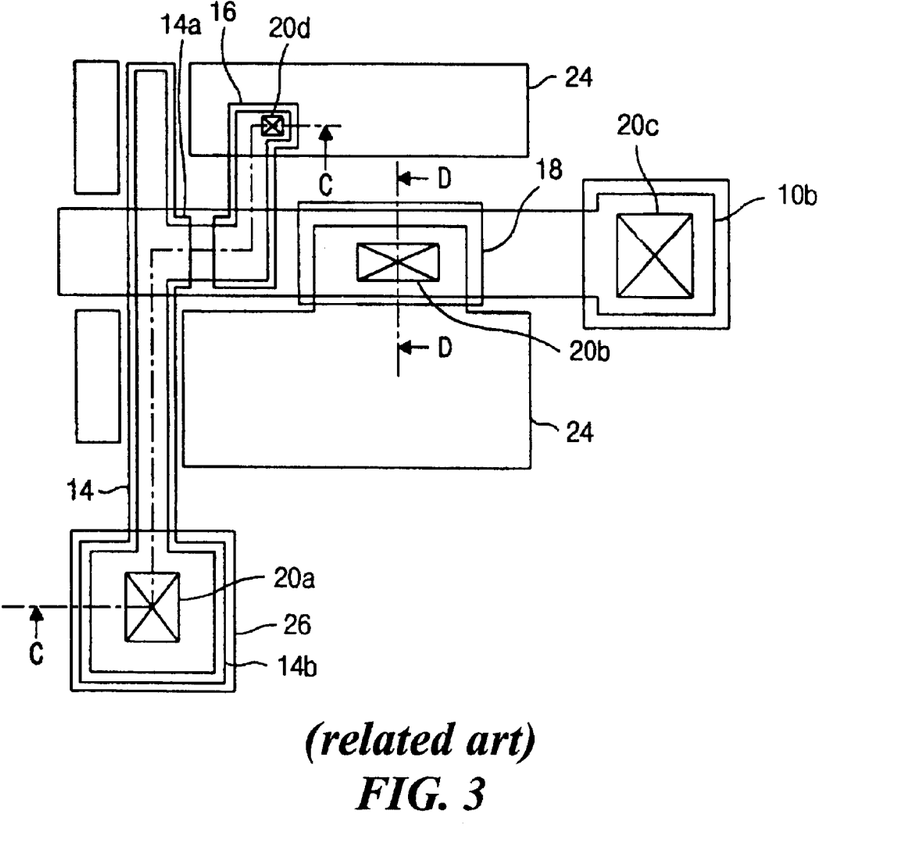
FIG. 3 is a plan view illustrating a completed array substrate according to the conventional manufacturing method.
Figure 4A:
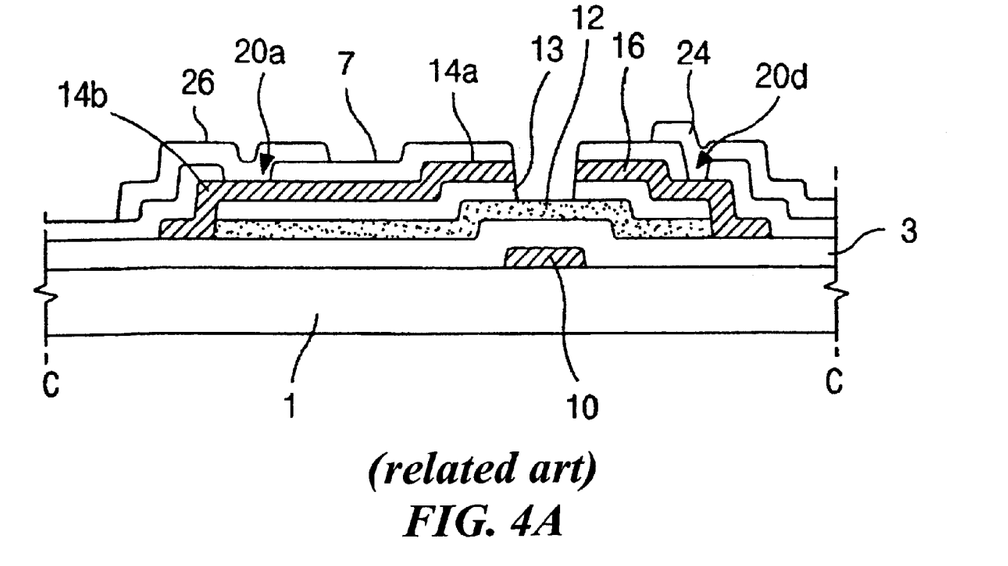
FIG. 4A is a cross-sectional view taken along the line "C—C" of FIG. 3.
Figure 4B:
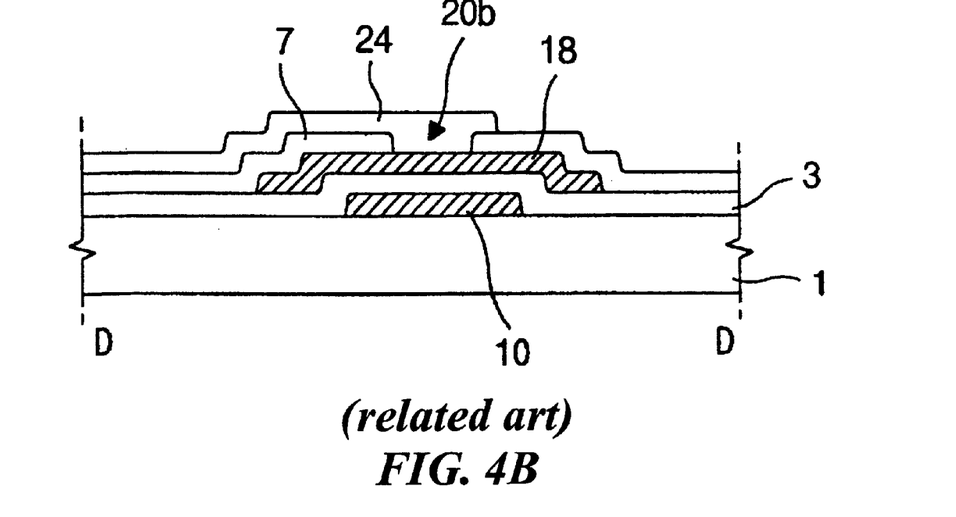
FIG. 4B is a cross-sectional view taken along the line "D—D" of FIG. 3.

FIGS. 3, 4A and 4B illustrate a completed array substrate for the liquid crystal display device.

On the whole surface including the patterned metal layer of FIG. 2, a second insulating layer 7 shown in FIGS. 4A and 4B is deposited, and patterned with a fourth mask so as to form a first to a fourth contact holes 20a, 20b, 20c, and 20d. The first contact hole 20a exposes a portion of the data pad 14b; the second contact hole 20b exposes a portion of the capacitor electrode 18; the third contact hole 20c exposes a portion of the gate pad 10b; and the fourth contact hole 20d exposes a portion of the drain electrode 16. Via the data and gate pads 14b and 16, an outer circuit transmits data and gate signals, respectively.

On the whole surface including the second insulating layer 7, an indium tin oxide (ITO) layer is deposited and patterned so as to form a pixel electrode 24 and a data pad terminal 26; the data pad terminal contacts with the data pad 14b through the first contact hole 20a.

Further, a portion of the pixel electrode 24 is electrically connected with the capacitor electrode 18 through the second contact hole 20b; another portion of the pixel electrode 24 is electrically connected with the drain electrode 16 through the fourth contact hole 20d.

At this point, the capacitor electrode 18, electrically connected with the pixel electrode 24 through the second contact hole 20b of FIG. 3, plays a role of an electrode of the storage capacitor; the overlapped portion of the gate line 10 under the capacitor electrode 18 plays a role of the other electrode of the storage capacitor.

Since the above-described conventional method of manufacturing the array substrate of the liquid crystal display device employs too many masks, the method has a disadvantage of too many-repeated photolithography steps, which results in high production cost and inferiority percentage.

SUMMARY OF THE INVENTION

In view of the foregoing and other problems of the conventional manufacturing method of the liquid crystal display device, it is an object of the present invention to provide a relatively low cost manufacturing method of the array substrate for the liquid crystal display device.

It is another object of the present invention to provide an improved array substrate for the liquid crystal display device manufactured by the above-mentioned method.

To achieve the above-mentioned objects, the present invention provides a four-mask method of manufacturing an array substrate of a liquid crystal display device and an array substrate fabricated by the method. The method includes forming a plurality of gate lines, gate electrodes and gate extension lines by depositing a first metallic material on a substrate and patterning the first metallic material with a first mask, the gate extension lines extending toward the opposite direction of the gate electrodes; forming a first insulating layer on the whole surface having gate lines, gate electrodes, and gate extension lines; forming a plurality of data lines, source electrodes, drain electrodes, and capacitor electrodes over the gate lines by depositing a semiconductor layer, an ohmic contact layer and a second metallic material sequentially on the first insulating layer, and patterning the second metallic material and the ohmic contact layer with a second mask; forming a passivation layer and a plurality of first and second contact holes by depositing a second insulating layer on the data lines, the source electrodes, the drain electrodes and the capacitor electrodes, and patterning the second insulating layer with a third mask, the first contact holes exposing a portion of the drain electrode, the second contact holes exposing a portion of the capacitor electrodes; and forming a plurality of pixel electrodes by depositing a transparent conductive layer on the passivation layer, and patterning the transparent conductive layer by a fourth mask, the pixel electrodes contacting the drain electrodes through the first contact holes and contacting the capacitor electrodes through the second contact holes.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Referring now to the drawings, and more particularly to FIGS. 5A to 10C, a preferred embodiment of the present invention will be described.

Figure 5A:
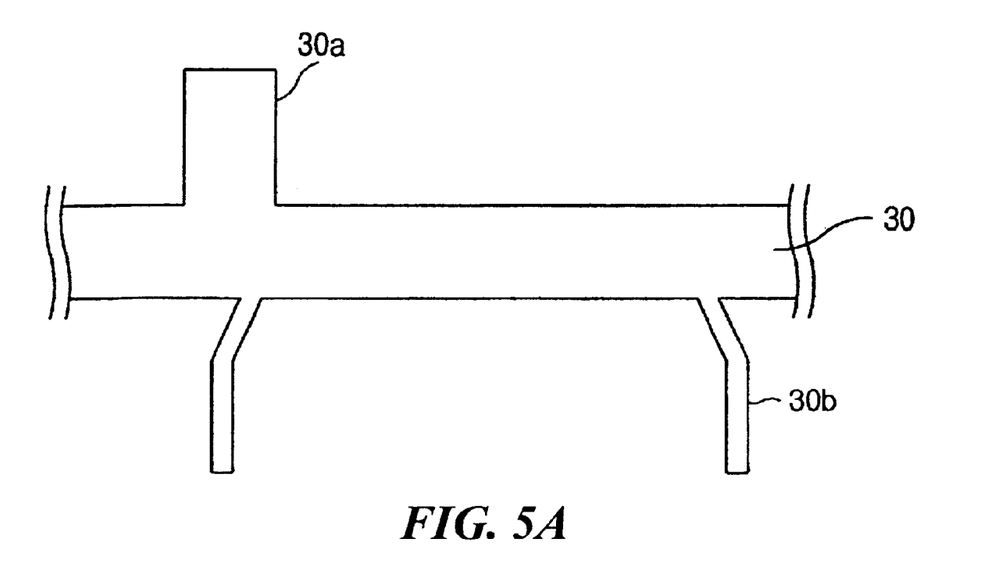
FIG. 5A is a plan view illustrating an array substrate formed by a first mask according to an embodiment of the present invention.

FIG. 5A illustrates a gate line formed with a first mask according to the preferred embodiment of the present invention.

In order to form the gate line 30 including a gate electrode 30a which is perpendicularly extended from a portion of the gate line 30, a first metallic material is deposited on a surface of a substrate (shown in FIG. 6A), and patterned by the first mask. The gate line 30 also has a couple of gate extension lines 30b spaced apart from each other and extended toward an opposite direction of the gate electrode 30a, and each of the gate extension lines 30b is formed near corresponding data line 34 and extended substantially parallel to the data line 34. The gate extension lines 30b serve to expand the capacity of a storage capacitor, which will be explained later in detail. Between the gate extension lines 30b, a pixel electrode will be located in a later step. The first metallic material is selected from a group consisting of molybdenum (Mo) and Chromium (Cr).

On the whole surface having the above-mentioned gate line 30 of the substrate, a first insulating material (not shown) is deposited. The first insulating material is made of silicon nitride ($SiN_x$) or silicon oxide ($SiO_2$); especially silicon nitride is widely used for the first insulating material.

Figure 5B:
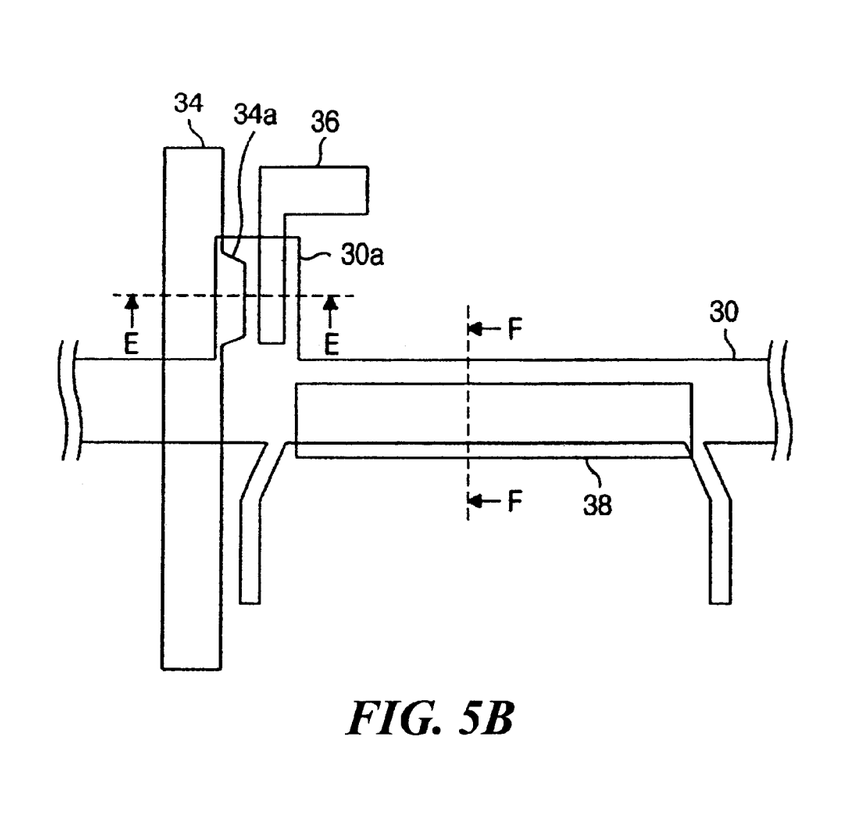
FIG. 5B is a plan view illustrating an array substrate formed by a second mask according to an embodiment of the present invention.
Figure 6A:
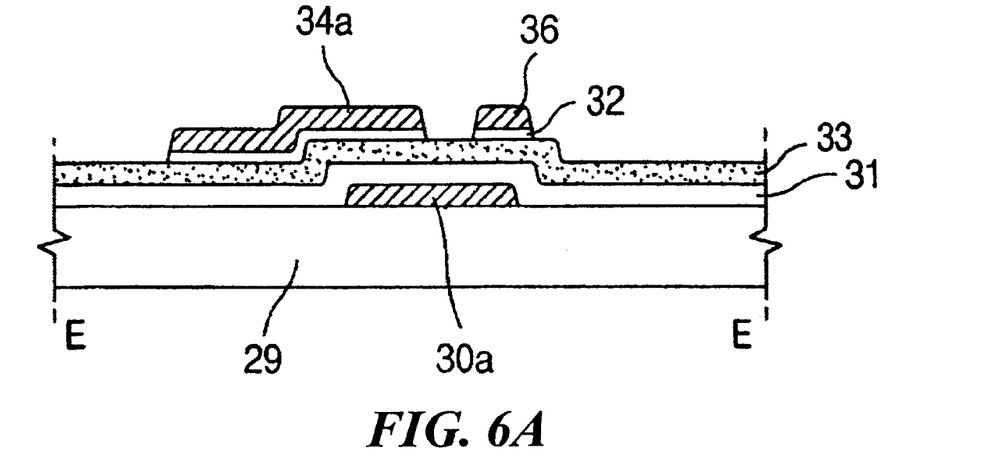
FIG. 6A is a cross-sectional view taken along the line "E—E" of FIG. 5B.
Figure 6B:
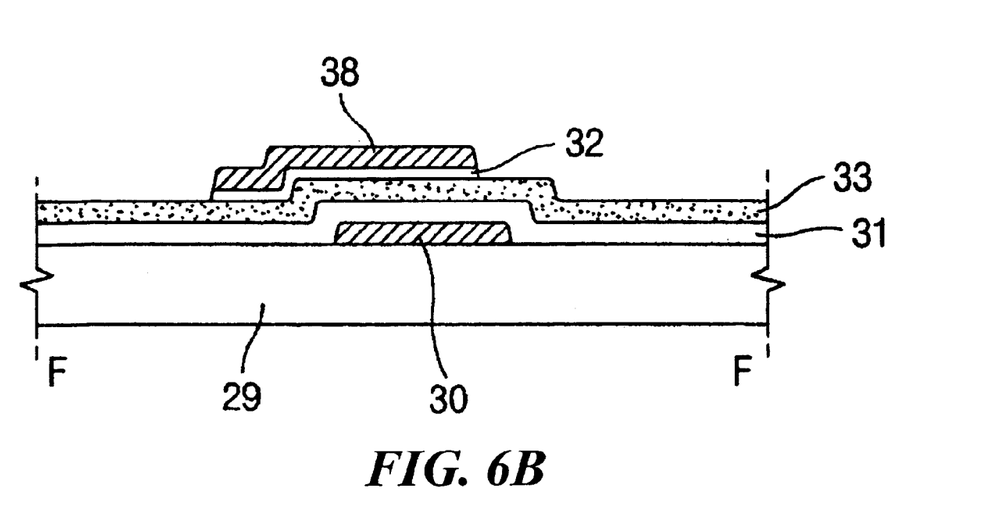
FIG. 6B is a cross-sectional view taken along the line "F—F" of FIG. 5B.

Next, as shown in FIGS. 5B, 6A and 6B, a semiconductor material, a doped semiconductor material and a second metallic material are sequentially deposited on the first insulating layer 31 of the substrate 29; the doped semiconductor layer and the second metal film are patterned with a second mask so as to form a data line 34, a source electrode 34a, a drain electrode 36, a capacitor electrode 38, a semiconductor layer 33, and an ohmic contact layer 32. The second metallic material is selected from a group consisting of molybdenum (Mo), and chromium (Cr); the semiconductor material is an amorphous silicon; and the doped semiconductor material is a doped amorphous silicon.

In FIG. 5B, the data line 34 is arranged perpendicular to the gate line 30; the source electrode 34a is protruded from the data line 34 near the cross point between the gate and data lines 30 and 34; the drain electrode 36, in the shape of an island, is formed spaced apart from the source electrode 34a. The source and the drain electrodes 34a and 36 overlap a portion of the gate electrode 30a; and a capacitor electrode 38, in the shape of another island longitudinally parallel to the gate line 30, is formed spaced apart from the data line 34, and overlaps a portion of the gate line 30.

Referring to FIGS. 6A and 6B, a more detailed description about the above-mentioned structure will be followed; FIGS. 6A and 6B illustrate cross-sections taken along lines "E—E" and "F—F" of FIG. 5B, respectively.

As mentioned previously, on the insulating layer 31, the semiconductor material, the doped semiconductor material, and the second metallic material are sequentially deposited; the doped semiconductor layer and the second metal film are patterned with the second mask.

In the conventional five-mask method of manufacturing the conventional liquid crystal display device, after the semiconductor layer and the doped semiconductor layer are patterned with the conventional second mask, the second metallic material is deposited, and patterned with the conventional third mask. But, in the four-mask method of manufacturing the liquid crystal display device according to the embodiment of the present invention, all of the semiconductor material, the doped semiconductor material, and the-second metallic material are sequentially deposited, and thereafter the doped semiconductor layer and the second metal film are patterned with the second mask. The semiconductor layer will be patterned with another mask in a later step.

Accordingly, since the conventional second mask is excluded, the number of masks decreases by one.

Figure 7:
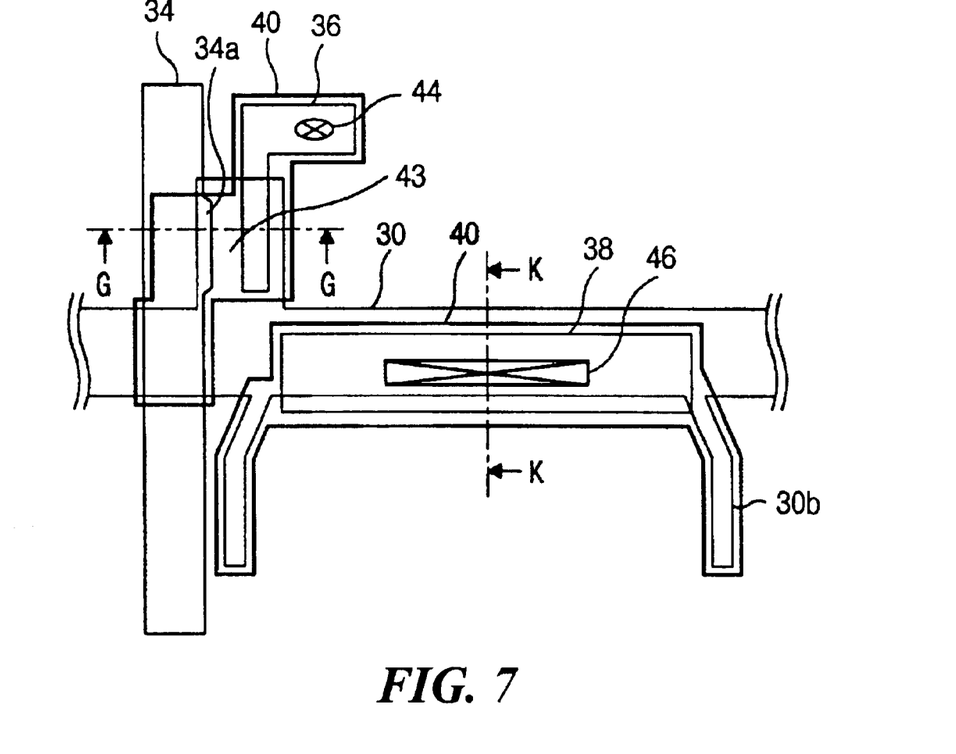
FIG. 7 is a plan view illustrating an array substrate formed by a third mask according to an embodiment of the present invention.
Figure 8A:
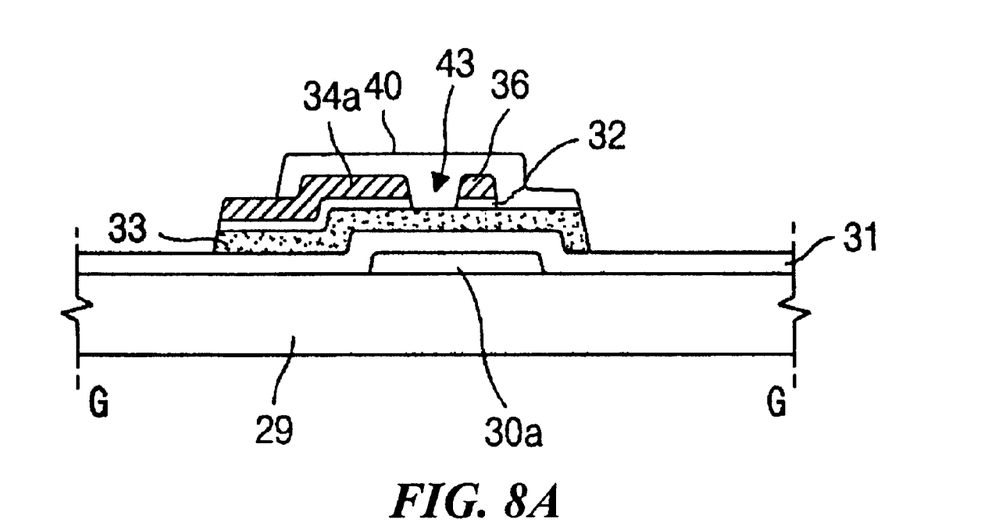
FIG. 8A is a cross-sectional view taken along the line "G—G" of FIG. 7.
Figure 8B:
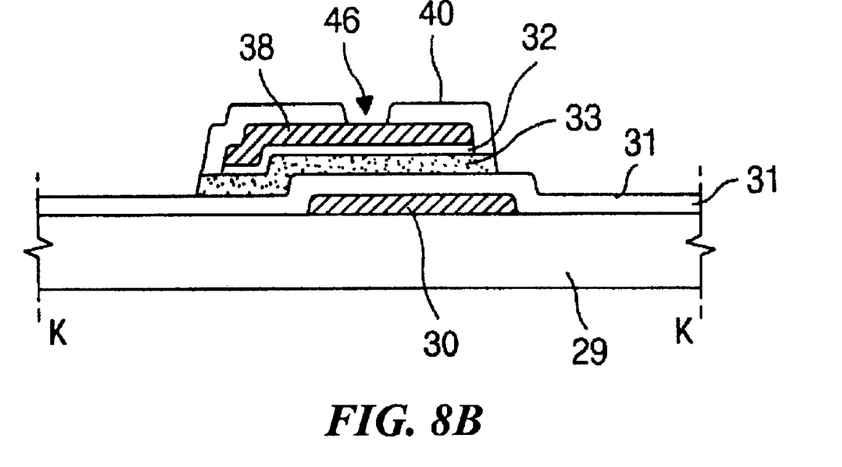
FIG. 8B is a cross-sectional view taken along the line "K—K" of FIG. 7.

FIGS. 7, 8A and 8B illustrate the array substrate formed just after a third mask step.

A second insulating material is deposited over the whole surface including the patterned second metal film, and patterned with the third mask so as to form a passivation film 40, and first and second contact holes 44 and 46.

For the sake of protection, the passivation film 40 covers a portion of the gate line 30, the gate extension lines 30b, the source and drain electrodes 34a and 36, a portion of the data line 34, the capacitor electrode 38, and a back channel 43 that is defined between the source and drain electrodes 34a and 36.

The first and the second contact holes 44 and 46 expose a portion of the drain and the capacitor electrodes 36 and 38, respectively.

FIGS. 9, 10A, 10B and 10C illustrate the array substrate formed just after a fourth mask step.

Figure 9:
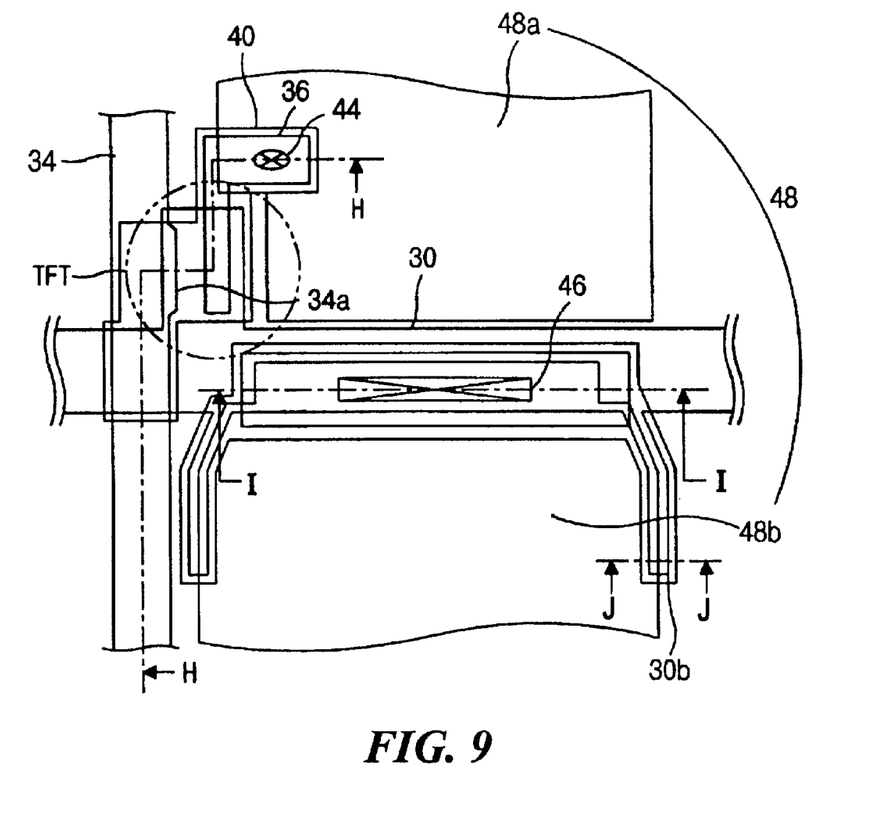
FIG. 9 is a plan view illustrating an array substrate formed by a fourth mask according to an embodiment of the present invention.

As shown in FIG. 9, a transparent conductive material is deposited on the whole surface including the passivation layer 40, and patterned with the fourth mask so as to form a pixel electrode 48 that is electrically connected with the drain electrode 36 through the first contact hole 44, and with the capacitor electrode 38 through the second contact hole 46. The pixel electrode 48 partially overlaps the gate extension lines 30b. The array substrate of the invention is for an active matrix type liquid crystal display, and thus the first and second pixel electrodes 48a and 48b are shown. In FIG. 9, The second pixel electrode 48b, which is not electrically connected with the "TFT", overlaps the gate line 30 included in the "TFT" as in the conventional art.

Figure 10A:
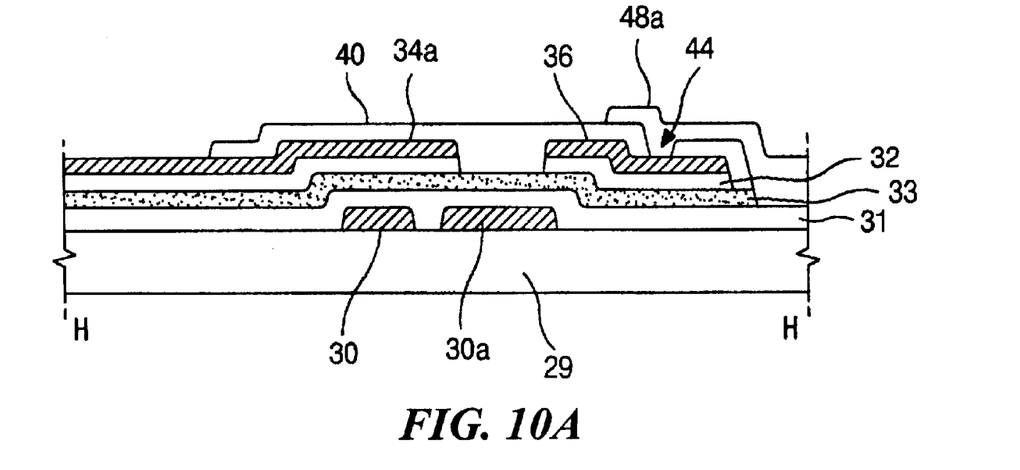
FIG. 10A is a cross-sectional view taken along the line "H—H" of FIG. 9.

As shown in FIG. 10A, the first pixel electrode 48a contacts with the drain electrode 36 through the first contact hole 44.

The pixel electrode 48 not only applies an electric field to the liquid crystal but also plays a role of an electrode of the storage capacitor. That is to say, the second pixel electrode 48b is electrically connected with the capacitor electrode 38 that plays the role of one electrode of the storage capacitor.

The storage-electrode-overlapping portion of the gate line 30 plays the role of the other electrode of the storage capacitor.

Figure 10B:
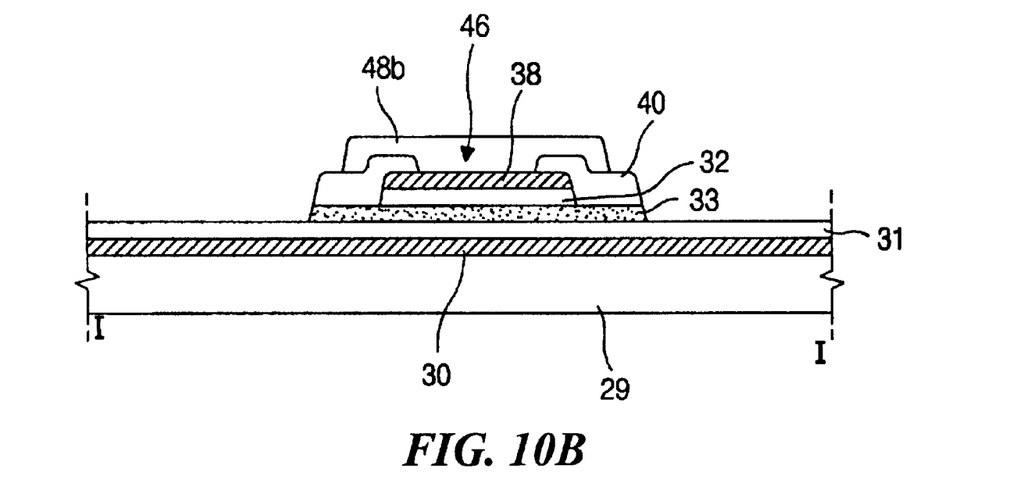
FIG. 10B is a cross-sectional view taken along the line "I—I" of FIG. 9.
Figure 10C:
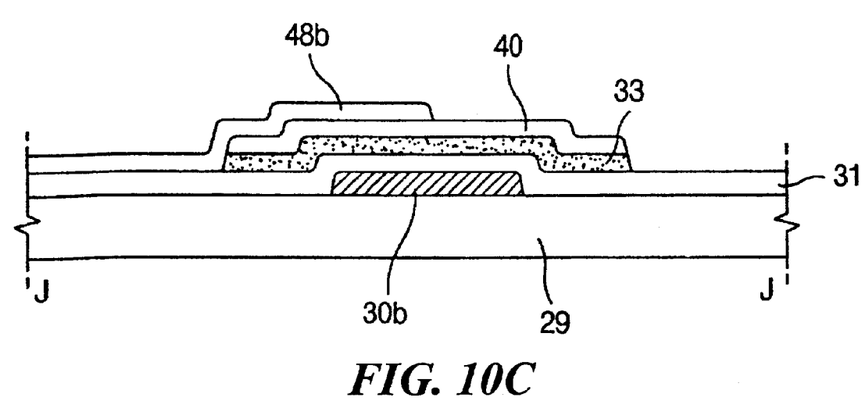
FIG. 10C is a cross-sectional view taken along the line "J—J" of FIG. 9.

FIGS. 10B and 10C illustrate the two different cross-sections of the storage capacitor. As shown in FIG. 10B, at the capacitor electrode 38, the transparent conductive material of the second pixel electrode 48b fills the second contact hole 46 so as to connect the capacitor electrode 38 and the pixel electrode 48b electrically. On the substrate 1, the gate line 30, the first insulating layer 31, the semiconductor layer 33, the ohmic contact layer 32, the capacitor electrode 38, the passivation film 40, and the pixel electrode 48 are formed sequentially.

Comparing with the conventional storage capacitor, since the semiconductor layer 31 is not patterned before this fourth mask step, and the ohmic contact layer 32 is patterned together with the capacitor electrode 38, portions of the semiconductor layer 31 and the ohmic contact layer 32 are included in the storage capacitor according to the embodiment of the present invention. The elongated vertical distance between the storage-electrode-overlapping portion of the gate electrode 30 and the capacitor electrode 38 decreases the capacity of the storage capacitor. But, since an expanded portion of the storage capacitor including the gate extension lines 30b, the corresponding covering portion of the passivation layer 40, and the corresponding overlapping portion of the second pixel electrode 48b compensates for the decrease in the capacity of the storage capacitor, the total capacity of the storage capacitor increases so as to improve the display quality of the liquid crystal display device.

FIG. 10C shows the cross-sectional structure of the expanded portion of the storage capacitor.

As shown in FIG. 10C, on the substrate 1, the gate-extension line 30b, the first insulating layer 31, the semiconductor layer 33, the passivation film 40, and the second pixel electrode portion 48b are formed sequentially.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of fabricating an array substrate for an active matrix type liquid crystal display device, the method comprising:

a) forming a plurality of gate lines and gate electrodes by depositing a first metallic material on a substrate and then patterning the first metallic material using a first mask;

b) forming a first insulating layer on the substrate, having gate lines, and gate electrodes formed in step a;

c) forming a plurality of data lines, source electrodes, drain electrodes, and capacitor electrodes by depositing a semiconductor layer, an ohmic contact layer and a second metallic material sequentially on the first insulating layer, and then patterning the second metallic material and the ohmic contact layer in a single step using a second mask;

d) forming a passivation layer having a plurality of first and second contact holes by depositing a second insulating layer on the data lines, the source electrodes, the drain electrodes and the capacitor electrodes, and then patterning the second insulating layer using a third mask, wherein, the first contact holes expose a portion of the drain electrode, and wherein, the second contact holes expose a portion of the capacitor electrodes; and e) forming a plurality of pixel electrodes by depositing a transparent conductive layer on the passivation layer, and then patterning the transparent conductive layer using a fourth mask, wherein, the pixel electrodes contact the drain electrodes through the first contact holes and contact the capacitor electrodes through the second contact holes.

2. The method according to claim 1, wherein, patterning using the first mask produces a plurality of gate extension lines that extend from the gate lines substantially parallel to the data lines.

3. The method according to claim 2, wherein the step of patterning the second insulating layer leaves a portion of said second insulating layer over at least part of the gate extension lines.

4. The method according to claim 2, wherein at least part of the pixel electrodes overlap at least part of the gate extension lines.

5. The method according to claim 1, wherein the transparent conductive layer is selected from a group consisting of indium tin oxide and indium zinc oxide.

6. The method according to claim 1, wherein the step of depositing the semiconductor layer produces an amorphous silicon layer.

7. The method according to claim 1, wherein the step of depositing a transparent conductive layer uses indium tin oxide.

8. The method according to claim 2, wherein the step of depositing a transparent conductive layer uses indium zinc oxide.

9. An array substrate fabricated by a method comprising:
(a) depositing a first metallic conductor on an exposed surface of a substrate;
(b) patterning said first metallic conductor using a first mask to produce a gate line and a gate pad that are connected together that extend in a first direction, the patterning further forming gate extension lines that extend perpendicular to said first direction;
(c) depositing a first insulating layer, an intrinsic semiconductor layer, a doped semiconductor layer, and a second metallic layer over a surface that results from step (b);
(d) patterning said doped semiconductor layer and said second metallic layer in a single step using a second mask so as to form a data line that crosses said gate line, a source electrode, a drain electrode, a capacitor electrode, a semiconductor layer, and an ohmic contact layer, wherein said data line extends in the same direction as said gate extension lines, and wherein said data line includes a protruding portion near said crossing that extends in said first direction;
(e) depositing a second insulating layer over a surface that results from step (d):
(f) patterning said second insulating layer deposited in step (e) using a third mask so as to form a passivation layer having first and second contact holes;
(g) depositing a conductive material on the surface that results from step (f); and
(h) patterning said conductive material deposited in step (g) to form first and second pixel electrodes.

10. An array substrate fabricated according to claim 9, wherein said second pixel electrode contacts said capacitor electrode through said second contact hole.

11. An array substrate fabricated according to claim 10, wherein said first pixel electrode contacts said drain electrode through said first contact hole.

12. An array substrate fabricated according to claim 9, wherein said second pixel electrode overlaps a portion said gate lines.

13. An array substrate fabricated according to claim 12, wherein said semiconductor layer is between said gate line and said second pixel electrode.

14. An array substrate fabricated according to claim 10, wherein said second pixel electrode overlaps said gate extension lines.

15. An array substrate fabricated according to claim 9, wherein said conductive material deposited in step (g) is transparent.

16. A method of fabricating an array substrate comprising:
a) forming gate lines and gate electrodes by depositing and patterning a first metal layer on a substrate using a first mask;
b) forming a first insulating layer over the substrate and over the gate lines and gate electrodes;
c) forming a semiconductor layer over the first insulating layer;
d) forming data lines, source electrodes, drain electrodes, and capacitor electrodes by depositing an ohmic contact layer and a second metal layer on the semiconductor layer and by patterning the ohmic contact layer and the second metal layer in a single step using a second mask;
e) forming a second insulation layer over the semiconductor layer, data lines, source and drain electrodes and capacitor electrodes;
f) forming first and second contact holes by patterning the second insulating layer using a third mask, wherein, the first contact holes expose portions of the drain electrodes, and wherein the second contact holes expose portions of the capacitor electrodes; and
g) etching the semiconductor layer such that the patterned second insulting layer and the data lines, source electrodes, drain electrodes, and capacitor electrodes act as protective masks.

17. The method of fabricating an array substrate according to claim 16, further including:
h) depositing a transparent conductive material on the second insulating layer; and
i) forming pixel electrodes by patterning the transparent conductive layer using a fourth mask;
wherein the pixel electrodes contact the drain electrodes through the first contact holes; wherein the pixel electrodes contact the capacitor electrodes through the second contact holes; and wherein step h is performed after step g.

18. The method of fabricating an array substrate according to claim 16, wherein step c is performed by depositing an amorphous silicon layer.

* * * * *